US012635109B2

(12) United States Patent
Sullivan et al.

(10) Patent No.: US 12,635,109 B2
(45) Date of Patent: May 19, 2026

(54) HEAT RECOVERY FROM COMPUTER COMPONENTS

(71) Applicant: MintGreen Blockchain Innovation Corp., Burnaby (CA)

(72) Inventors: Colin Patrick James Sullivan, Burnaby (CA); Alexandre David James Tardif, Burnaby (CA); Rohan Thapar, Surrey (CA)

(73) Assignee: MintGreen Blockchain Innovation Corp., Burnaby (CA)

( * ) Notice: Subject to any disclaimer, the term of this patent is extended or adjusted under 35 U.S.C. 154(b) by 404 days.

(21) Appl. No.: 18/320,807

(22) Filed: May 19, 2023

(65) Prior Publication Data

US 2023/0380105 A1     Nov. 23, 2023

Related U.S. Application Data

(60) Provisional application No. 63/365,059, filed on May 20, 2022.

(51) Int. Cl.
H05K 7/20        (2006.01)
G06F 1/20        (2006.01)

(52) U.S. Cl.
CPC ......... H05K 7/20263 (2013.01); G06F 1/206 (2013.01); H05K 7/20236 (2013.01); H05K 7/20272 (2013.01)

(58) Field of Classification Search
CPC ........... H05K 7/20781; H05K 7/20236; H05K 7/20272; H05K 7/20263; H05K 7/20818;
H05K 7/203; H05K 7/20327; H05K 7/20; H05K 7/20281; H05K 7/20381; H05K 7/20772; H05K 7/2079; H05K 7/208; H05K 7/20809; H05K 7/20836; H05K 5/0026; H05K 7/14; H05K 7/20636; G06F 1/20; G06F 2200/201; G06F 1/206; G06F 1/26; H01L 23/473; H01L 23/44; A61B 2018/00023; A61B 2018/025; F24T 10/10; F28D 15/00; F28D 1/0426;
(Continued)

(56) References Cited

U.S. PATENT DOCUMENTS

| | | | | |
|---|---|---|---|---|
| 10,194,559 B2 * | 1/2019 | Saito | .......................... | G06F 1/20 |
| 2005/0069432 A1 * | 3/2005 | Tomioka | ................. | G06F 1/203 |
| | | | | 257/E23.098 |

(Continued)

*Primary Examiner* — Michael A Matey
(74) *Attorney, Agent, or Firm* — DLA Piper LLP (US)

(57) ABSTRACT

An example of an apparatus to recover heat from heat generating elements is provided. The apparatus includes a closed-loop fluid flow system having a fluid charged therein. The fluid is to absorb heat. In addition, the apparatus includes a heat exchanger disposed along the closed-loop fluid flow system to remove the heat from the fluid. Furthermore, the apparatus includes a chamber disposed along the closed-loop fluid flow system to receive the fluid at an inlet and to release the fluid from an outlet. The apparatus also includes a plurality of heat generating elements disposed in the chamber. Each heat generating element of the plurality of heat generating elements is immersed in the fluid. The apparatus additionally includes a pump to circulate the fluid in the closed-loop fluid flow system between the heat exchanger and the chamber.

6 Claims, 12 Drawing Sheets

(58) Field of Classification Search
CPC .... F28D 2021/0031; F28D 9/00; F28F 13/06;
F28F 2265/26; F28F 3/005; F28F 9/001
See application file for complete search history.

(56) References Cited

U.S. PATENT DOCUMENTS

| | | | | |
|---|---|---|---|---|
| 2007/0139888 A1* | 6/2007 | Hamman | ............. | H01L 23/473 |
| | | | | 257/E23.098 |
| 2009/0071636 A1* | 3/2009 | Novotny | ............... | F28F 9/0258 |
| | | | | 165/104.33 |
| 2009/0139698 A1* | 6/2009 | Robinson | ............. | H01L 23/473 |
| | | | | 165/104.31 |
| 2011/0315355 A1* | 12/2011 | Campbell | .......... | H05K 7/20809 |
| | | | | 165/104.33 |
| 2011/0317367 A1* | 12/2011 | Campbell | ............. | H05K 7/203 |
| | | | | 361/700 |
| 2014/0124174 A1* | 5/2014 | Campbell | .......... | H05K 7/20809 |
| | | | | 29/890.035 |
| 2014/0246177 A1* | 9/2014 | Chamberlin | ........... | H02K 5/203 |
| | | | | 165/104.33 |
| 2015/0109730 A1* | 4/2015 | Campbell | .......... | F28D 15/0266 |
| | | | | 165/104.27 |
| 2017/0127563 A1* | 5/2017 | Chainer | ............. | H05K 7/20818 |
| 2018/0153059 A1* | 5/2018 | Dehlsen | ............. | H05K 7/20754 |
| 2018/0231330 A1* | 8/2018 | Barmeier | ........... | F28D 20/0056 |
| 2018/0246550 A1* | 8/2018 | Inaba | ................ | H05K 7/20254 |
| 2022/0113094 A1* | 4/2022 | Pagelsen | ............. | F28D 20/0034 |
| 2022/0400577 A1* | 12/2022 | Smith | .................... | F24T 10/30 |
| 2023/0025254 A1* | 1/2023 | Curtis | ............... | H05K 7/20254 |
| 2023/0046075 A1* | 2/2023 | Chen | ................. | H05K 7/20272 |

* cited by examiner

120

HEAT RECOVERY FROM COMPUTER COMPONENTS

CROSS-REFERENCE TO RELATED APPLICATIONS

This application claims priority to U.S. Provisional Application No. 63/365,059, filed May 20, 2022, which is herein incorporated by reference in its entirety.

BACKGROUND

Computers are used in many aspects of modern day life. In particular, computers are used to carry out instructions quickly and provide for the automation of many processes. One area in which computers have particularly excelled at is in the area of performing calculations based on mathematical formulas. In operation, computers use electricity to manipulate components to carry out the calculations. Due to inherent resistance in the conditioning incoming current and the delivery of electricity to various components of the computer system, heat is generated. For any process or calculation demanding a large amount of computational resources, a large amount of heat may be generated.

An example of a computer system that may generate a large amount of heat as a result of computer calculations is a system used for mining cryptocurrency. Cryptocurrency is a digital currency that is secured by cryptography through a process often referred to as mining. In use, an online ledger with cryptography secures online transactions of cryptocurrency between parties. Cryptocurrency mining is used for many cryptocurrencies to add security to the cryptocurrency network and process transactions. Cryptocurrencies as a technology can offer many increased efficiencies when compared to traditional financial systems, which has seen their use and proliferation increase over time. As cryptocurrencies become more widespread and cryptocurrency networks become larger, more computing power is used for mining to secure these networks and process transactions, producing heat energy as a waste product. Other examples of computer systems generating a large amount of heat may involve server systems used to model complex mathematical systems, such as classification models or simulation modelling.

BRIEF DESCRIPTION OF THE DRAWINGS

Reference will now be made, by way of example only, to the accompanying drawings in which.

DETAILED DESCRIPTION

Some examples of this disclosure, illustrating its features, will now be discussed in detail. The words "comprising", "having", "containing", and "including", and other forms thereof are intended to be equivalent in meaning and be open-ended in that an item or items following any one of these words is not meant to be an exhaustive listing of such item or items or meant to be limited to only the listed item or items.

It is also noted that as used herein and in the appended claims, the singular forms "a", "an", and "the" include plural references unless the context dictates otherwise. Although any systems and methods similar or equivalent to those described herein can be used to practice or test examples of the present disclosure, the preferred systems and methods are now described.

Examples of the present disclosure will be described more fully after this with reference to the accompanying drawings in which like numerals represent like elements throughout the several figures and in which examples are shown. However, examples of the claims may be in many different forms and are not to be construed as limited to the examples set forth herein. The examples set forth herein are non-limiting examples and are merely examples among other possible examples.

Computer systems may generate a large amount of heat during operation primarily due to resistive heating in its electrical components. The amount of heat generated by a computer system is dependent on multiple factors which include the hardware design as well as the speed and number of calculations carried out by the computer system. For example, cryptocurrency mining hardware often carries out a large number of calculations and may generate enough heat to operate at temperatures that may damage the hardware if not the heat is not managed. In particular, the hardware may be designed to operate at temperatures of about 80° C. to about 100° C., and if the temperatures exceed this, permanent damage and a significant reduction of the useful life of the hardware may occur. The low operating temperatures of the hardware produces low-grade heat considered to be waste heat and that is generally not recovered for most industrial processes or electricity generation. Accordingly, waste heat produced by cryptocurrency mining is vented to the atmosphere through convection or conduction.

However, recovery of low-grade heat may have some applications, such as space heating in homes and buildings. Low-grade heat may also have further applications in some manufacturing processes, such as food and beverage production or pulp and paper manufacturing. Nevertheless, recovering the low-grade waste heat from cryptocurrency mining is often not economically feasible due to the large capital expenditure, high overhead, and considerable infrastructure involved with a heat recovery system.

Figure 1:
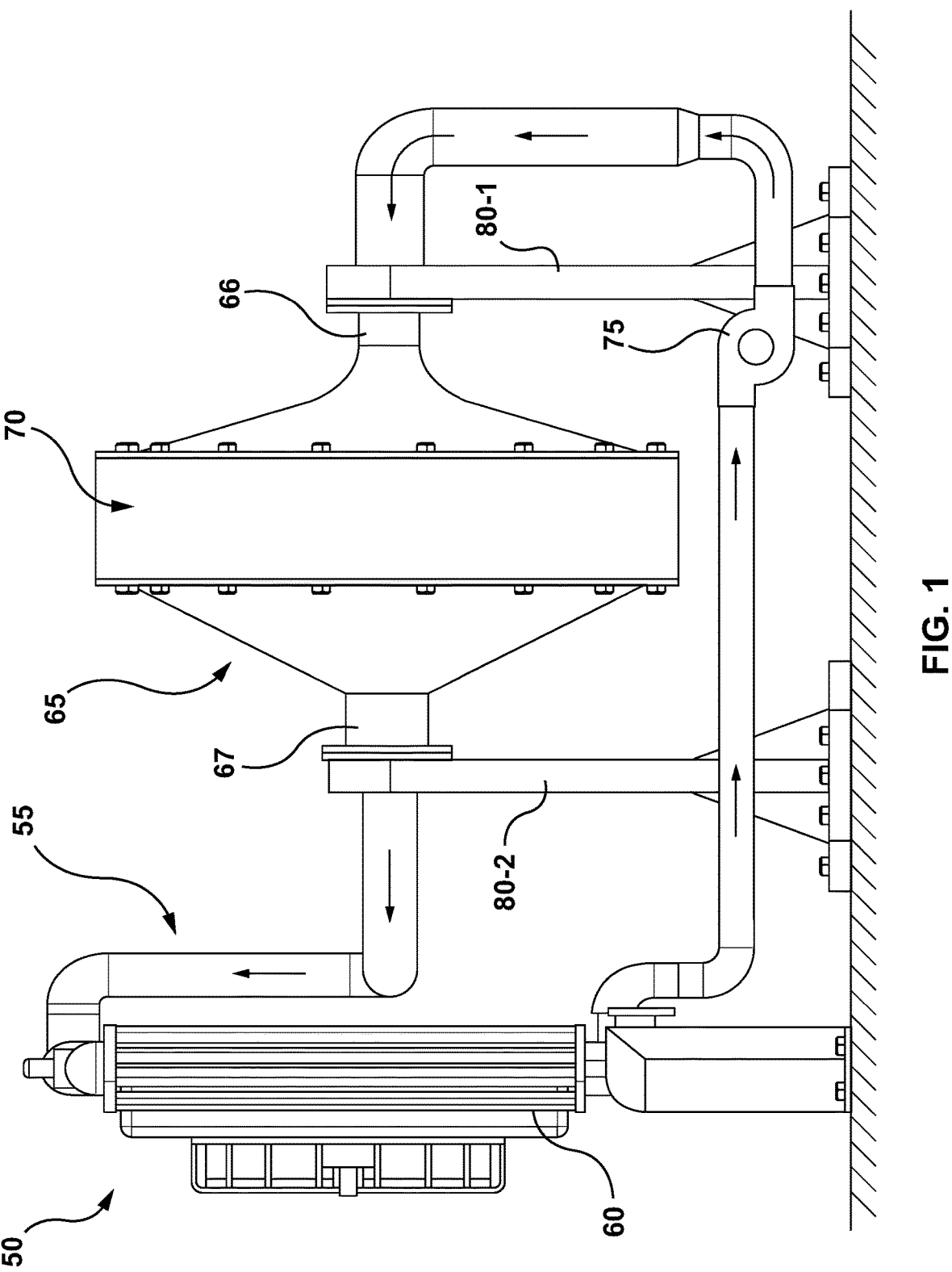
FIG. 1 is a view of an example of an apparatus to recover heat from heat generating elements.

Referring to FIG. 1, an apparatus 50 to recover heat from heat generating elements is generally shown. In the present example, the apparatus 50 is a closed-loop mining system to secure cryptocurrency by carrying out a large number of calculations. During operation, the apparatus 50 may generate thermal energy that can be recovered and supplied or employed at different scales of commercial and residential use. In particular, the thermal energy generated by the apparatus 50 may be heat energy generated during the mining process of cryptocurrency because the mining of cryptocurrency uses electrical power that is released to the surroundings in the form of heat, due to resistive losses from the continuous mining process. Furthermore, the apparatus 50 may provide a mechanism to efficiently recover heat energy from cryptocurrency mining, which may be utilized for other applications that may otherwise use a separate heat source. In the present example, the apparatus 50 includes a fluid flow system 55, a heat exchanger 60, a chamber 65, a plurality of heat generating elements 70, and a pump 75.

The fluid flow system 55 is to include a fluid charged therein to absorb heat and to carry the heated fluid from one portion of the fluid flow system to another portion of the fluid flow system. In the present example, the fluid flow system 55 is a closed-loop system such that the fluid charged therein is sealed from the ambient environment. Accordingly, the mass of fluid in the fluid flow system 55 remains substantially constant as evaporative loss does not occur. Since the mass of fluid in the fluid flow system 55 absorbs heat and releases heat during operation, the volume of the fluid may vary with this changing temperature. The manner by which the volume change is addressed in the fluid flow system 55 is not particularly limited. For example, the fluid flow system 55 may include a bladder tank to allow for expanding volumes. In other examples, the fluid flow system 55 may be designed to accommodate higher pressures such that volume expansion of the fluid is prevented resulting in higher pressures.

It is to be appreciated by a person of skill with the benefit of this description that the fluid charge in the fluid flow system 55 is not particularly limited. As the fluid is to be used to absorb and transport heat from one component of the apparatus 50 to another component, the fluid may be selected to provide the physical characteristics that can facilitate this process. For example, the fluid may be a fluid with a high heat capacity to allow for the absorption of more heat per mass of fluid. In the present example, the fluid may have a heat capacity above about 1.0 J/g° C. In other examples, the fluid may have a heat capacity above about 4.0 J/g° C. In the present example, the fluid used in the fluid flow system 55 is also a non-conductive fluid such that it may flow over electrical components without causing any shorts or arcing. Examples of suitable fluids may include synthetic oil-based fluids, mineral oil based fluids, de-ionized water, refrigerant fluids (e.g. R143a), fluoro-carbon based fluids, and petroleum based fluids.

The heat exchanger 60, also referred to as a heat exchanging unit, is disposed along the fluid flow system 55. The heat exchanger 60 is to absorb and remove the heat from the fluid in the fluid flow system 55 and to transfer the heat away from the fluid flow system 55. The manner by which the heat exchanger 60 removes heat from the fluid is not particularly limited. In the present example, the heat exchanger 60 is constructed from materials which can separate the fluid in the fluid flow system 55 from an external heating application, such as a space heating application to provide hot air for a space or water heating source. Some examples of suitable materials to separate the fluid in the fluid flow system 55 from the external environment while facilitating heat transfer from the fluid in the fluid flow system 55 to an external heating application include copper, stainless steel, aluminum, and other similar materials. The exact configuration of the heat exchanger 60 is not particularly limited. For example, the fluid flow through the heat exchanger 60 may follow a tortuous route to increase surface area for heat transfer. In other examples, the heat exchanger 60 may include internal fins, baffles, or protrusions to increase heat transfer efficiency by increasing the surface area.

In the present example, the chamber 65 is also disposed along the fluid flow system 55. The chamber 65 is connected to the heat exchanger 60 and provides heated fluid to the heat exchanger 60. In operation, the chamber 65 is to receive cool fluid at an inlet 66. The fluid is heated inside the chamber 65 as discussed in further detail below. The heated fluid is released from the chamber 65 via an outlet 67 and transported to the heat exchanger 60 via the fluid flow system 55 where the heat is removed from the fluid. The cooled fluid is then transported back to the chamber 65 via the fluid flow system 55 to complete the cycle through the fluid flow system.

Figure 2:
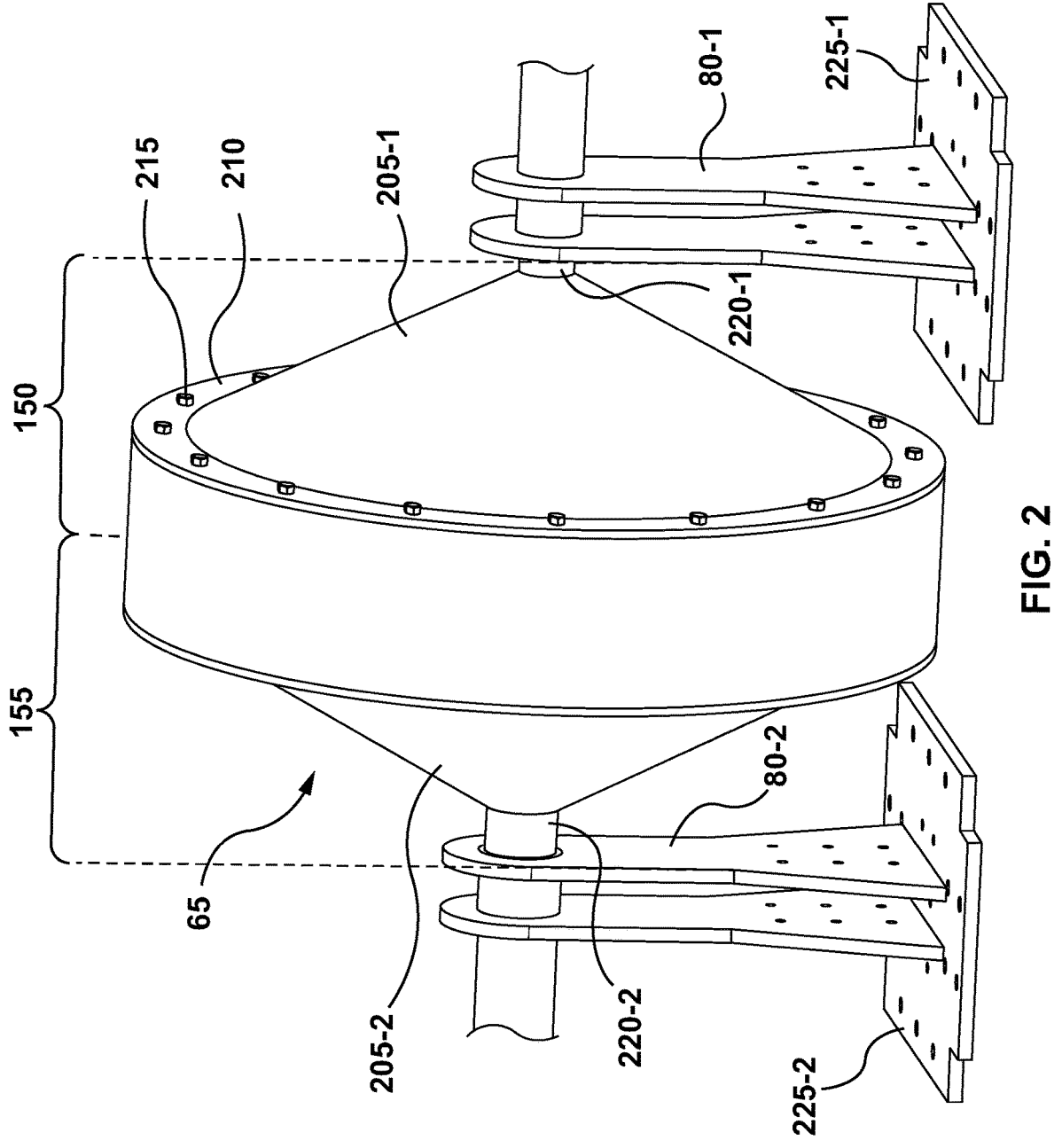
FIG. 2 is a perspective view of a chamber of the apparatus shown in FIG. 1.

The design of the chamber 65 is not particularly limited and different designs are contemplated. An example of a design is shown in greater detail in FIG. 2. As shown, the chamber 65 is supported by supports 80-1 and 80-2 (generically, these supports are referred to herein as "support 80" and collectively referred to as "supports 80"). In this example, the chamber 65 is designed to allow the fluid to flow in a generally horizontal direction from right to left. In other examples, the chamber 65 may be configured for fluid flow in the opposite direction. Further examples are also contemplated where the chamber 65 may be oriented vertically or at another angle, such as for accommodating for an available space in which the apparatus 50 is to be placed.

The fluid in the chamber 65 is heated by a plurality of heat generating elements 70 disposed therein. It is to be appreciated by a person of skill with the benefit of this description that the heat generating elements 70 are not limited and may be a collection of different elements that generate heat during operation. In the present example, the heat generating elements 70 are computer components operating to mine cryptocurrency. In other examples, the heat generating elements 70 may be computer components carrying out computational operations for other applications, such as modelling complex physical systems, simulations, or machine learning. The manner by which the heat generating elements 70 transfer heat to the fluid is also not limited. Examples of heat generating elements 70 may include power supply units, connectors, control units, hashing boards, wiring, circuit boards, etc. or any combinations thereof.

In the present example, the heat generating elements 70 are completely immersed in the fluid such that heat may be conducted directly from the electrical components to the fluid via contact. In this example, it is to be understood by a person of skill with the benefit of this description that the fluid is to be a non-conductive or insulating fluid to avoid shorting of electrical components immersed in the same fluid. In other examples, the heat generating elements 70 may include a protective covering or coating to protect against shorting and arcing. While the protective covering or coating is to be an electric insulator, the covering or coating is to be a thermal conductor to allow for generated heat from each heat generating element 70 to reach the fluid where the heat can be absorbed and carried away. By adding a protective covering or coating, it is to be appreciated that a wider variety of fluids, including conductive fluids, may be used.

The pump 75 is to circulate the fluid within the fluid flow system 55. In the present example, the pump 75 is to maintain the flow of the fluid at a predetermined flow rate to absorb heat from the heat generating elements 70. The pump 75 is not particularly limited and may be any type of pump capable of pumping the fluid through the fluid flow system 55. In the present example, the pump 75 may be a centrifugal pump, gear pump, rotary vane pump, diaphragm pump, piston pump, screw pump (peristaltic pump), or any other style of pump capable of pumping consistent volumes at a relatively stable pressure through the fluid flow system 55. Accordingly, the pump 75 circulates the fluid between the chamber 65, which heats up the fluid, and the heat exchanger 60, which removes the heat to another application.

In the present example, a controller (not shown) may be used to control the operation of the pump 75. In particular, the controller may be connected to sensors at various locations along the fluid flow system 55, such as pressure sensors, and control the operation of the pump 75 to maintain a substantially constant target pressure throughout the fluid flow system 55. The sensors may also include temperature sensors to monitor the temperature of the fluid in the fluid flow system 55 and allow for adjustments to the pressure and/or flow of the fluid to provide sufficient cooling of the heat generating elements 70.

Figure 3:
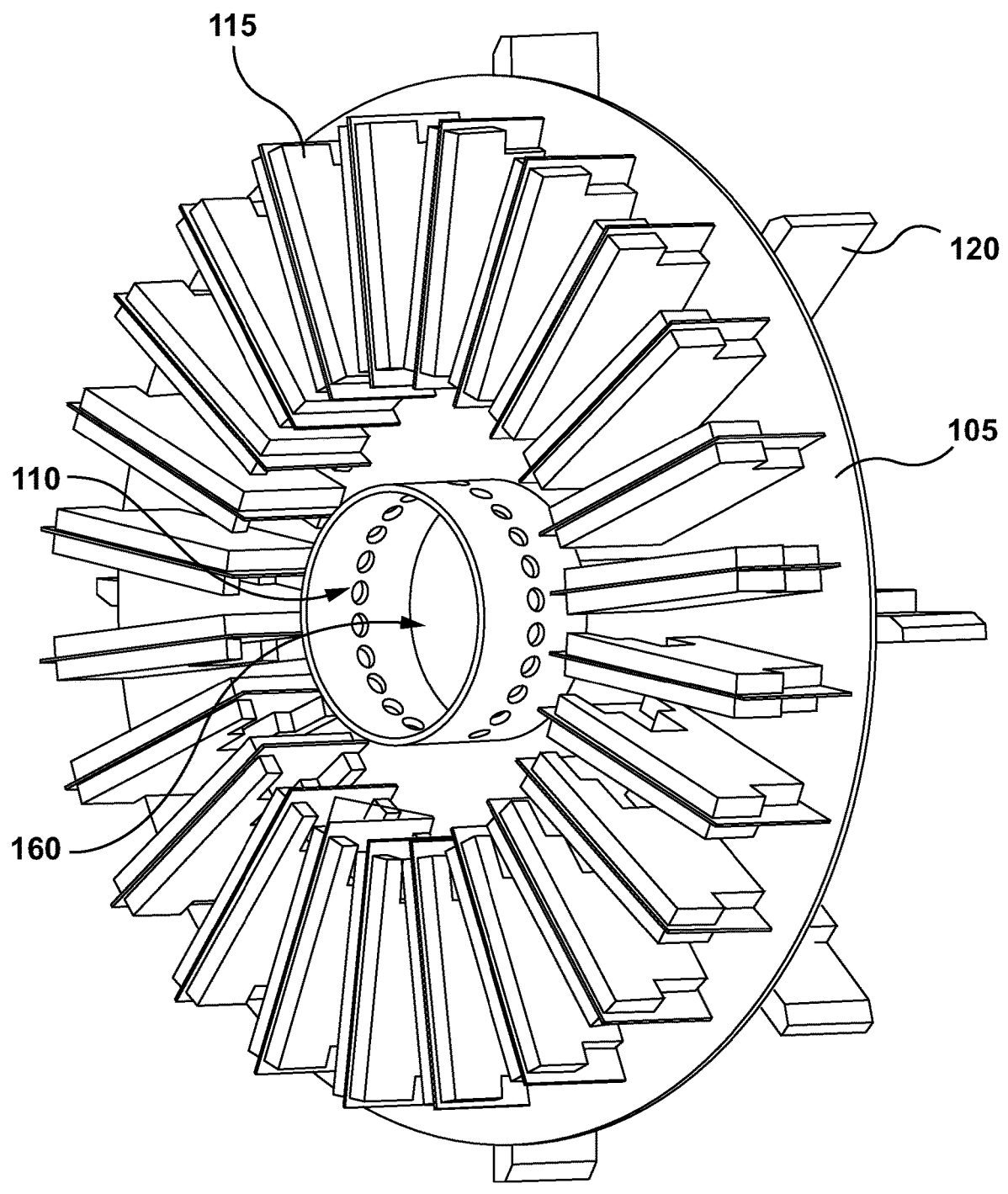
FIG. 3 is a perspective view from the outlet side of the internal components of the chamber of the apparatus shown in FIG. 1.
Figure 4:
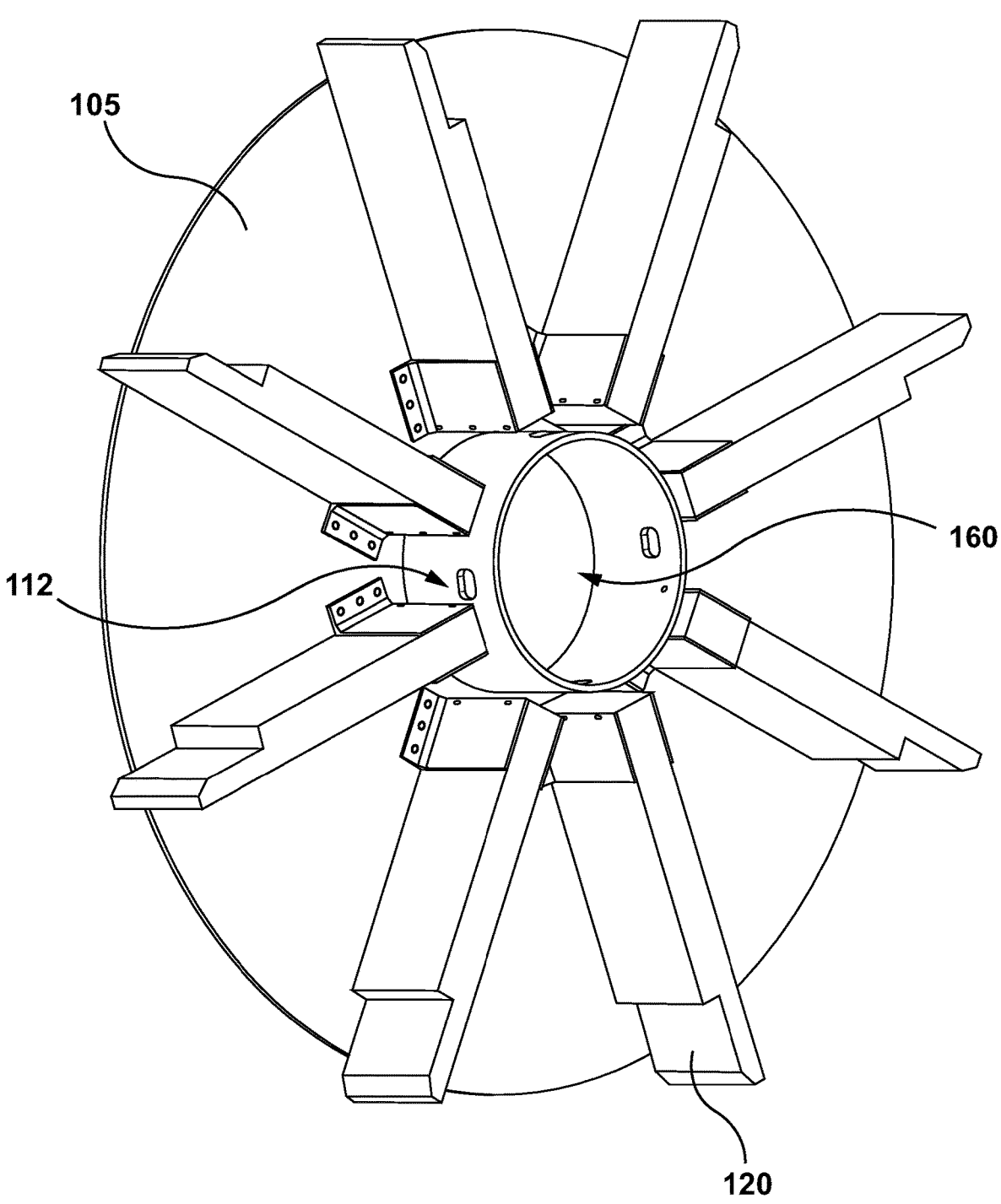
FIG. 4 is a perspective view from the inlet side of the internal components of the chamber of the apparatus shown in FIG. 1.
Figure 5:
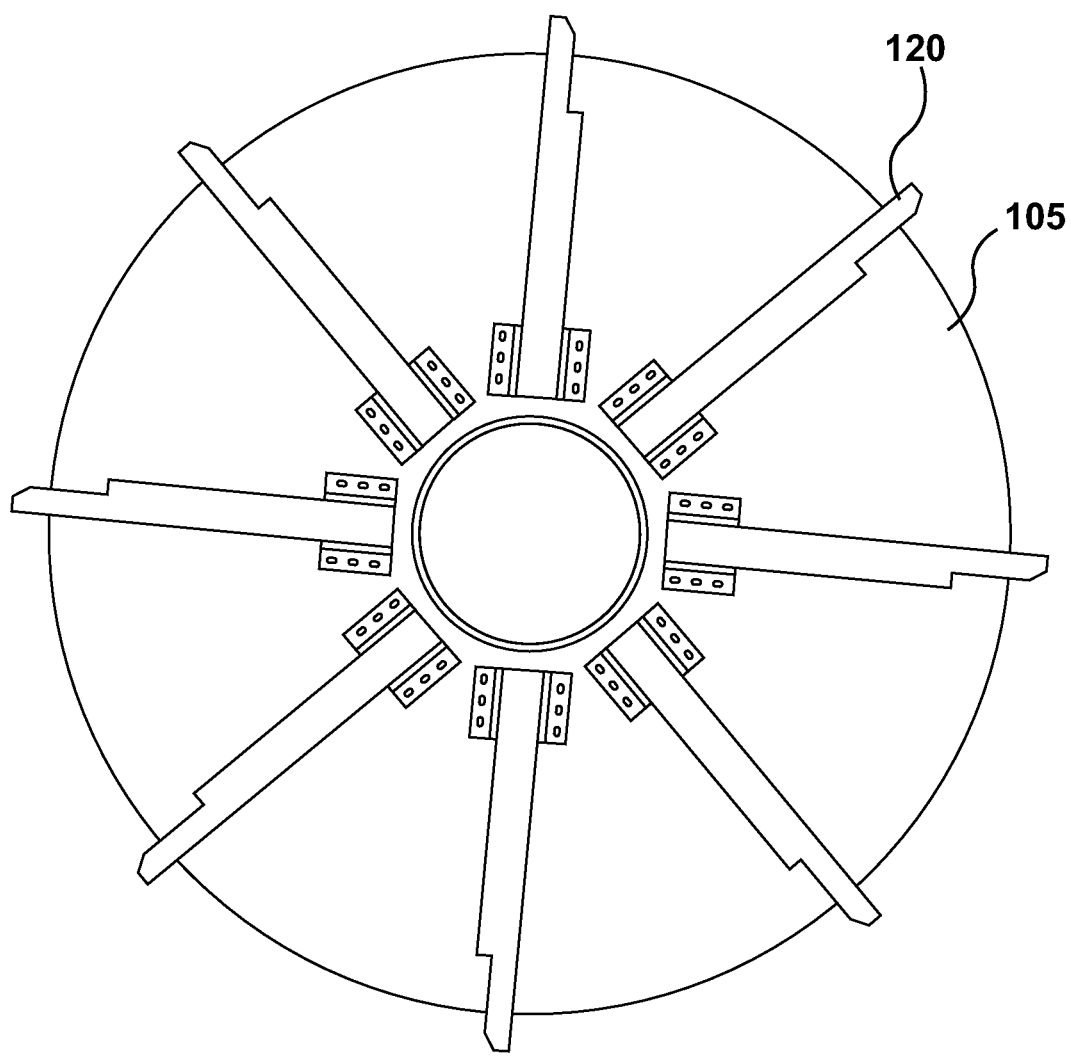
FIG. 5 is a plan view of the inlet side of the internal components of the chamber of the apparatus shown in FIG. 1.

Referring to FIGS. 3 to 5, different angles of the internal components of the chamber 65 of the present example, which include the plurality of heat generating elements 70, is shown. In the present example, the plurality of heat generating elements 70 includes a plurality of processing units 115, such as hashing boards and control units used to mine cryptocurrency, on one side of the chamber 65 and a plurality of power supply units 120 on the other side of the chamber 65. The processing units 115 and power supply units 120 are shown in greater detail in FIGS. 6 and 7, respectively. Each side of the chamber 65 forms a radial layer within two substantially conical housings 205-1 and 205-2 (generically, these conical housings are referred to herein as "conical housing 205" and collectively referred to as "conical housings 205"). The conical housings 205 enclose the two portions in the chamber 65 which are divided by a separation wall 105 disposed therein. In the present example, the separation wall 105 is disposed between the inlet 66 and the outlet 67 such that the portion closer to the inlet 66 may be referred to as an inlet portion 150 and the portion closer to the outlet 67 may be referred to as an outlet portion 155. In the present example, the fluid may be delivered from the inlet 66 to the separation wall 105 with a tube extending through the conical housing 205-1. The fluid may flow through the holes 112 to flood the conical housing 205-1 of the inlet portion. On the outlet portion, the holes 110 collect the fluid on the outlet portion where the fluid travels to the outlet 67 via another tube through the opposite conical housing 205.

The manner by which the chamber 65 is designed is not limited and may involve the use of various rings and fasteners to connect the components within the chamber 65. The conical sections of the chamber 65 provide a more gradual change of direction of fluid flowing within them, reducing the flow resistance within the chamber 65. However, variations are contemplated. For example, the conical housings 205 may be replaced with flat circular plates to decrease the overall space used by the chamber 65 at a cost of increasing flow resistance. In a configuration with flat circular plates, rings may be used to joined components or rings may also be included as an integral part of the chamber walls. As another example, two conical housings 205 may be formed from an elongated tube extending outwards normal to a first side and a second side of the radial layer.

In the present example, the supports 80 may be may be fixed to a base, frame, or load bearing surface (not shown). The supports 80 on each side of the chamber 65 may be provided with openings at another end to receive the elongated tube at each end of the chamber 65 and to support the chamber 65 when it is filled with the fluid of the fluid flow system 55. In other examples, more or less supports 80 may be used. For example, some examples may include a single support for the chamber 65 when the support 80 and chamber 65 are mechanically strong enough to support its weight.

The manner by which the conical housings 205 of the chamber 65 are connected is not limited and may involve coupling outer rings 210 around the circumference of the plurality of heat generating elements 70, using a plurality of fasteners 215. Further, each conical housing 205-1 and 205-2 may be provided with a tube 220-1 and 220-2, respectively. Further, the supports 80-1 and 80-2 may be secured to plates 225-1 and 225-2, respectively, using permanent or removable joining techniques, such as fastening, welding, press-fitting or adhering. The plates 225-1 and 225-2 may rest or be secured to a base. For example, the base may be a floor, roof, or a frame assembly consisting of joined members.

Inside the chamber 65 of the present example, the plurality of heat generating elements 70 may be configured to form a radial layer coupled with the outer rings 210 in the present example. The outer rings 210 are coupled around the circumference of the inlet portion 150 and the outlet portion 155 of the chamber 65, using the plurality of fasteners 215. Further, the plurality of the fasteners 215 may be coupled with the conical housings 205. The separation wall 105 disposed between the inlet portion 150 and the outlet portion 155 is to direct the flow of fluid radially over the heat generating elements 70 by blocking access through the central annular section 160 in the present example. In some alternative examples, the central annular section 160 may be modified to direct fluid flow from the inlet 66 towards the all of the heat generating elements 70 on both sides of the separation wall 105 as discussed in further detail below. In this example, the central annular section 160 may be provided with a first plurality of holes 110 and a second plurality of holes 112 to provide fluid outlets from the annular section 160 to both sides of the separation wall 105. In another example, the separation wall 105 may extend through the center of the annular section 160 to supply fluid from the inlet 66 radially outwards through the plurality of holes 112 over the power supply units 120, returning over the processing units 115 towards the annular section 160 through the plurality of holes 110.

As discussed above, the radial layer may comprise a plurality of power supply units 120 disposed in the inlet portion 150 of the chamber 65 along the radius of the radial layer. The plurality of power supply units 120 may supply power to the processing units 115 to operate and carry out calculations, such as to mine cryptocurrency, with connections receiving power from an external source. Each of the plurality of power supply units 115 may be configured to operate on about 100 volts to about 600 volts, either with single phase or three phase alternating current, supplied via a connector. Further, the radial layer may include a plurality of control units disposed near the processing units 115 or the power supply units 120 and connected via electrical connections.

The processing units 115 may also include one or more hashing boards disposed on the opposite side of the separation wall 105 in the outlet portion 155 of the chamber 65.

The hashing boards may be referred to as hash cards or simply as hash boards, and are electrical components that include the computing hardware responsible for performing various operations, such as cryptographic mining calculations. In some examples, the separation wall 105 may be omitted such that all the heat generating elements 70 are disposed within a single section. In this example, the plurality of heat generating elements 70 may be disposed along the radius of the chamber 65 to form mining units in the present example. Each mining unit includes a power supply unit 120 and a processing unit 115 with a control unit and at least one hashing board grouped together. In further examples, an ethernet switch (not shown) may be included as a heat generating element 70 and configured to provide the internet access used for cryptocurrency mining. This ethernet switch may receive internet access from an external connection or from a wireless connection, and may be configured to provide internet access to each processing unit 115.

Referring again to FIG. 3, the plurality of processing units 115, each including at least one hashing board, is disposed radially on the separation wall 105. The radial layer may include the central annular section 160 at the center to draw fluid towards the annular section 160 through the plurality of holes 110 integrated around a cross-section of the central annular section 160. In another example where the annular section 160 allows fluid to pass through the separation wall 105, the plurality of holes 110 may supply the fluid from the inlet 66 over the plurality of processing units 115 of the radial layer. The hashing board of each processing unit 115 may be powered from each of the plurality of power supply units 120. The manner by which the processing units 115 and their components receive power is not limited. For example, the processing units 115 with at least one control unit and at least one hashing board may be configured to receive power supply from at least one of the plurality of power supply units 120. The control unit may be programmed to control hashing of at least one or more hashing boards. The radial layer may also include a plurality of plate separators (not shown) embedded into the separation wall 105 similar to the hashing boards. Each hashing board may be separated using the plate separators (also referred to as struts herein). Each plate separator may be provided with connection means coupled at one side of each plate separator. Each hashing board may include a PCB with a plurality of mining chips disposed on a first surface and/or a second surface of each hashing board.

Figure 6:
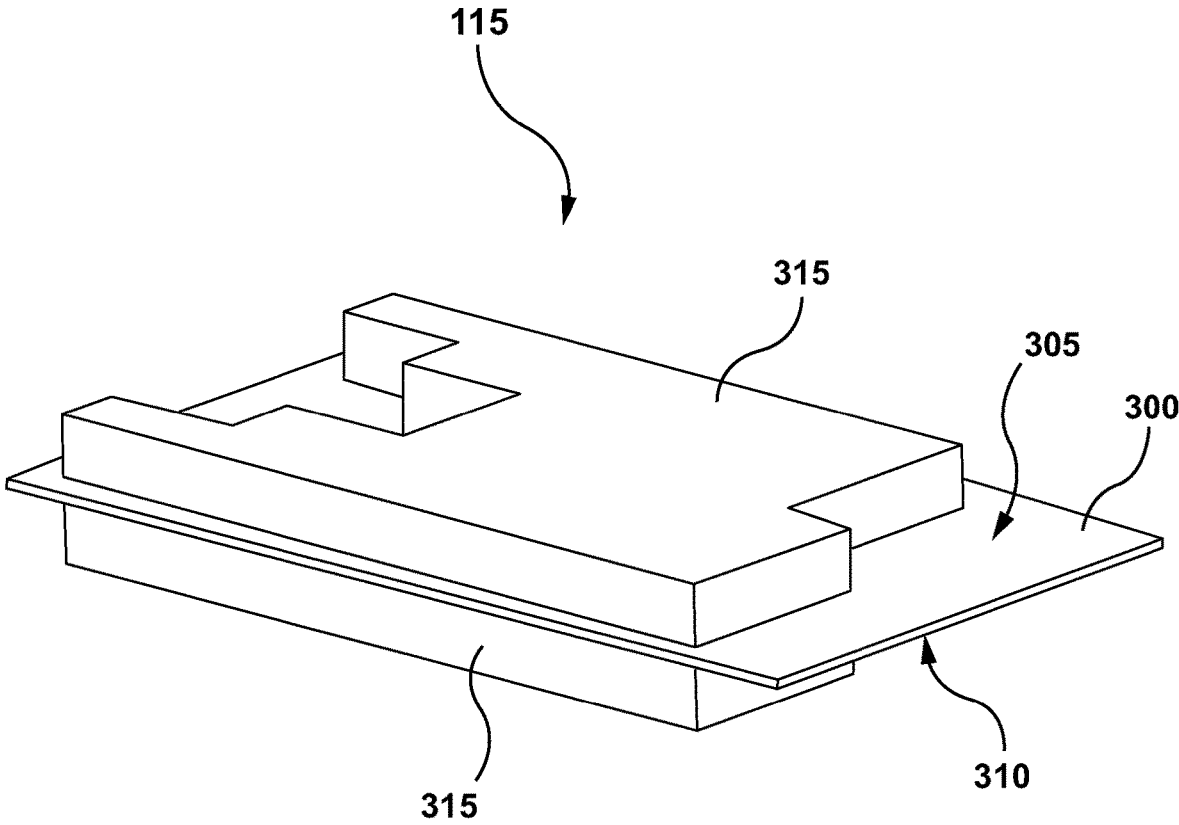
FIG. 6 is a perspective view of a processing unit of the apparatus shown in FIG. 1.

Referring to FIG. 6, a processing unit 115 is shown. In particular, the hashing board 300 of the processing unit 115 is shown. The hashing board 300 may be referred to as a hash board or bitcoin miner, or crypto harvester. In the present example, the hashing board 300 is a circuit board assembly of electrical components. The hashing board 300 may comprise a first surface 305 and a second surface 310. The hashing board 300 may comprise a plurality of mining chips (not shown) embedded over at least one of the surfaces 305 and 310. Each chip may be designed to include one or more heat sink units 315 to remove heat generated by the hashing board 300 during operation, such as cryptocurrency mining, into the fluid passed over the hashing board 300.

The hashing board 300 may include electrical connectors disposed on the surface 305 or the surface 310. In the present example, two cable connectors may be configured to provide power from the power supply unit 120 and control data from the control unit (not shown). In other examples, power from the power supply unit 120 and data from the control unit may be delivered via a single connector with multiple conductors. The hashing board 300 may be configured to receive power from the power supply unit 120 to perform the mining process continuously.

Figure 7:
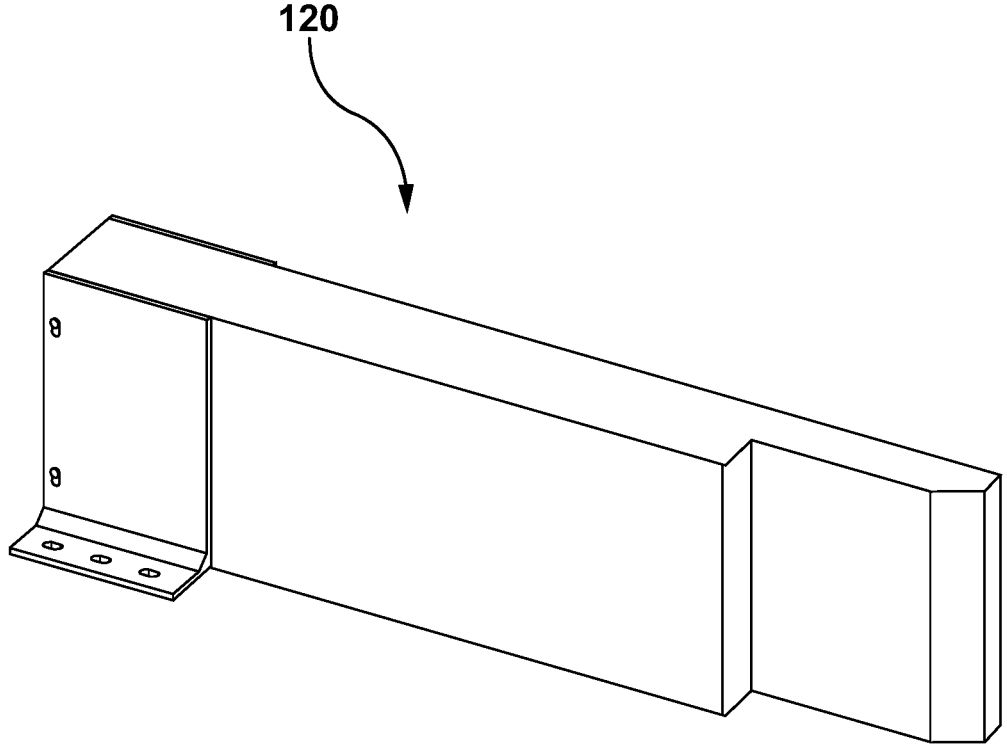
FIG. 7 is a perspective view of a power supply unit of the apparatus shown in FIG. 1.

Referring to FIG. 7, a power supply unit 120 is shown. In the present example, the power supply unit 120 supplies power to one or more processing units 115. Furthermore, the power supply unit 120 may receive a power supply from an external power source coupled to the power supply unit 120. The power supply unit 120 is a device programmed to control the amount of the power supply of processing units 115 and the components of the processing units 115, such as the hashing board 300 and the control unit to perform continuous mining operations. In the present example, the power supply unit 120 is configured to receive at least about 120 volts to about 440 volts of alternating current supply from an external source. In other examples, the power supply unit 120 may be configured to receive a direct current power supply from the external source using different bus bars or connectors.

The positioning of the various heat generating elements 70 is not particularly limited and many different architectures are contemplated. For example, an architecture may place a plurality of power supply units 120 and control units located on the same side of the separation wall 105 of the radial layer. Each of the plurality of power supply units 120 may then be connected to one or more hashing boards 300 via a connector and a control unit. In the example shown in FIG. 5, eight power supply units 120 and eight associated control units (not shown) are disposed over the separation wall 105. The power supply units 120 may provide power to twenty-four hashing boards 300 disposed on the opposite side of the separation wall 105. The radial layer may be divided into eight segments, with each segment as a separate unit. Each segment may include one power supply unit 120, a control unit, and three hashing boards 300. In the present example, the power supply unit 120 may be configured to receive an alternating current power supply of about 120 volts to about 440 volts using busbars or cable connections.

Figure 8:
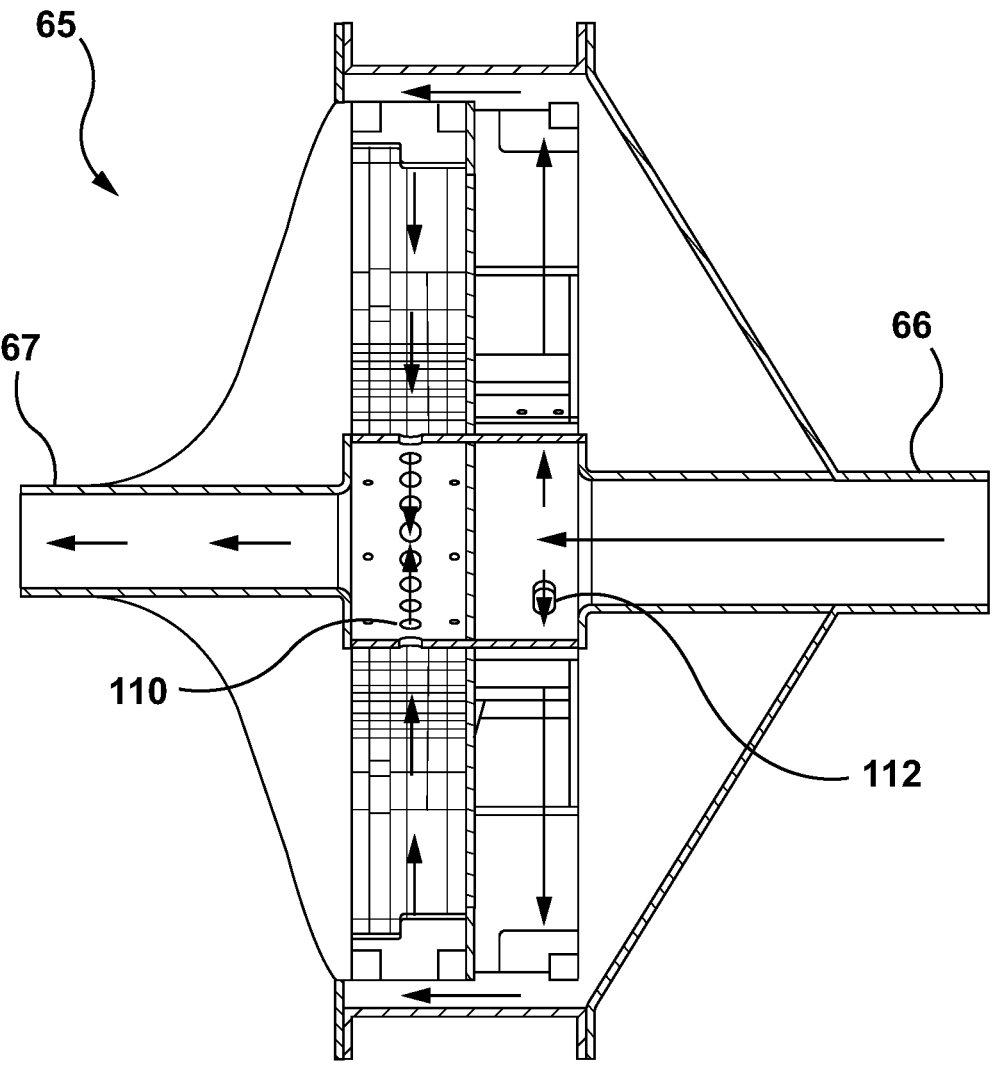
FIG. 8 is a cross sectional view of the chamber of the apparatus shown in FIG. 1 showing fluid flow therein.

Referring to FIG. 8, a sectional view of the chamber 65 is shown to illustrate the flow of fluid through the chamber 65 in the present example. In this example, the separation wall 105 extends through the annular section 160 such that fluid does not pass in a straight line from the inlet 66 to the outlet 67. It is to be appreciated by a person of skill with the benefit of this description that in some examples, a plate or barrier may be placed centrally within annular section 160 instead of having the separation wall 105 extend through the annular section 160 to separate the fluid flow in annular section 160. In this example, the fluid may enter through the inlet 66 into annular section 160, where the fluid is diverted by the separation wall 105 to flow radially away from the inlet 66 through a plurality of holes 112 over the power supply units 120 in the inlet portion 150 towards openings that separate the inlet portion 150 from the outlet portion 155 along the border of the separation wall 105 proximate to the walls of the chamber 65. Once the fluid flows from the inlet portion 150 to the outlet portion 155, the fluid passes through processing units 115 in the outlet portion 155 in a substantially radial direction as the fluid is diverted and driven back towards annular section 160 where the fluid is collected through holes 110 and released via the outlet 67.

It is to be appreciated by a person of skill with the benefit of this description that the direction of fluid flow is not limited. In the present example, the fluid flows over the power supply units 120 prior to flowing over the processing units 115 since the processing units 115 generate significantly more heat than the power supply units 120. By passing the fluid over the components that generate less heat first, the downstream components are not subjected to a larger rise in temperature from upstream heat generating elements 70, which may reduce the life expectancy of the components.

Figure 9:
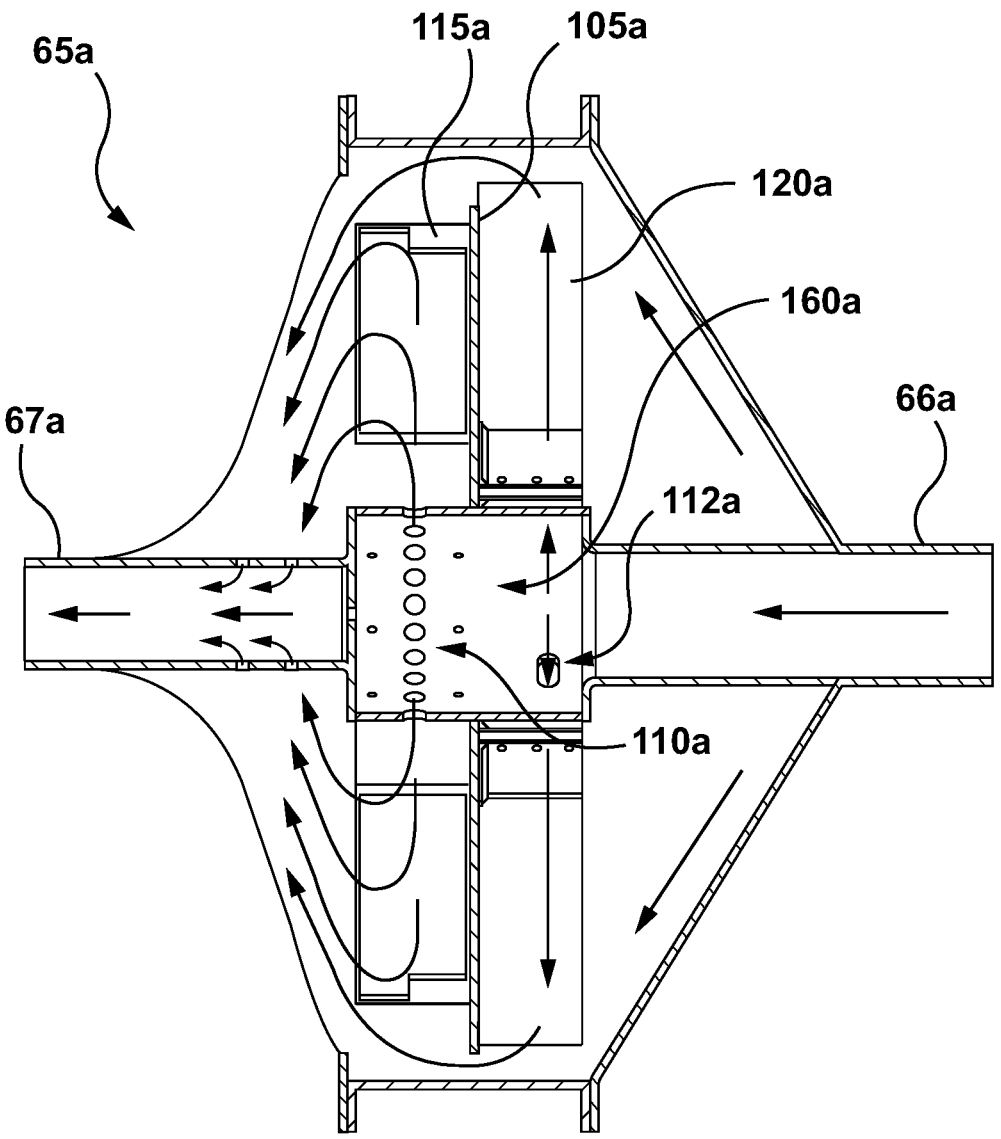
FIG. 9 is a cross sectional view of a chamber of another example of an apparatus showing fluid flow therein.

Referring to FIG. 9, a sectional view of a chamber 65*a* is shown to illustrate the flow of fluid through the chamber 65*a* in another example. Like components of the chamber 65*a* bear like reference to their counterparts in the chamber 65, except followed by the suffix "a". The radial layer may be comprised of the plurality of processing units 115*a* and power supply units 120*a*, with fluid supplied from the inlet 66*a* into the annular section 160*a*. In the present example, the annular section 160*a* does not have a central wall and the separation wall 105*a* does not extend into the annular section 160*a*. Accordingly, the fluid is dispersed over both sides of the separation wall 105*a* via a plurality of holes 110*a* and a second plurality of holes 112*a* of annular section 160*a*. The fluid may flow over the processing units 115*a*, and the power supply units 120*a* towards the outlet 67*a*.

In some examples, the fluid flow may further reduce heat concentrations over the processing units 115*a* by the oscillation or continuous rotation of the radial layer. In this example, the fluid may be supplied towards the annular section 160*a* of the radial layer via the inlet 66*a*. Further, the fluid may flow over the processing units 115*a* via holes 110*a*, thereby flowing over the plurality of hashing boards 300. The fluid may also simultaneously flow over the power supply units 120*a* via the plurality of holes 112*a*. In some examples, the radial layer may also oscillate between 0-270 degrees or rotate continuously. The fluid may flow from one end to another end of each processing unit 115*a*. During the course, the fluid may absorb heat from each processing unit 115*a*. In one example, the fluid may be any non-conductive fluid with a high specific heat capacity. Further, the heated fluid flow may be diverted towards the outlet portion 155 of the chamber. After getting diverted the flow over the heat generating elements, the flow of the heated fluid may be further diverted along an internal surface of chamber 65*a*. The heated fluid flows towards the outlet 67*a*.

Figure 10:
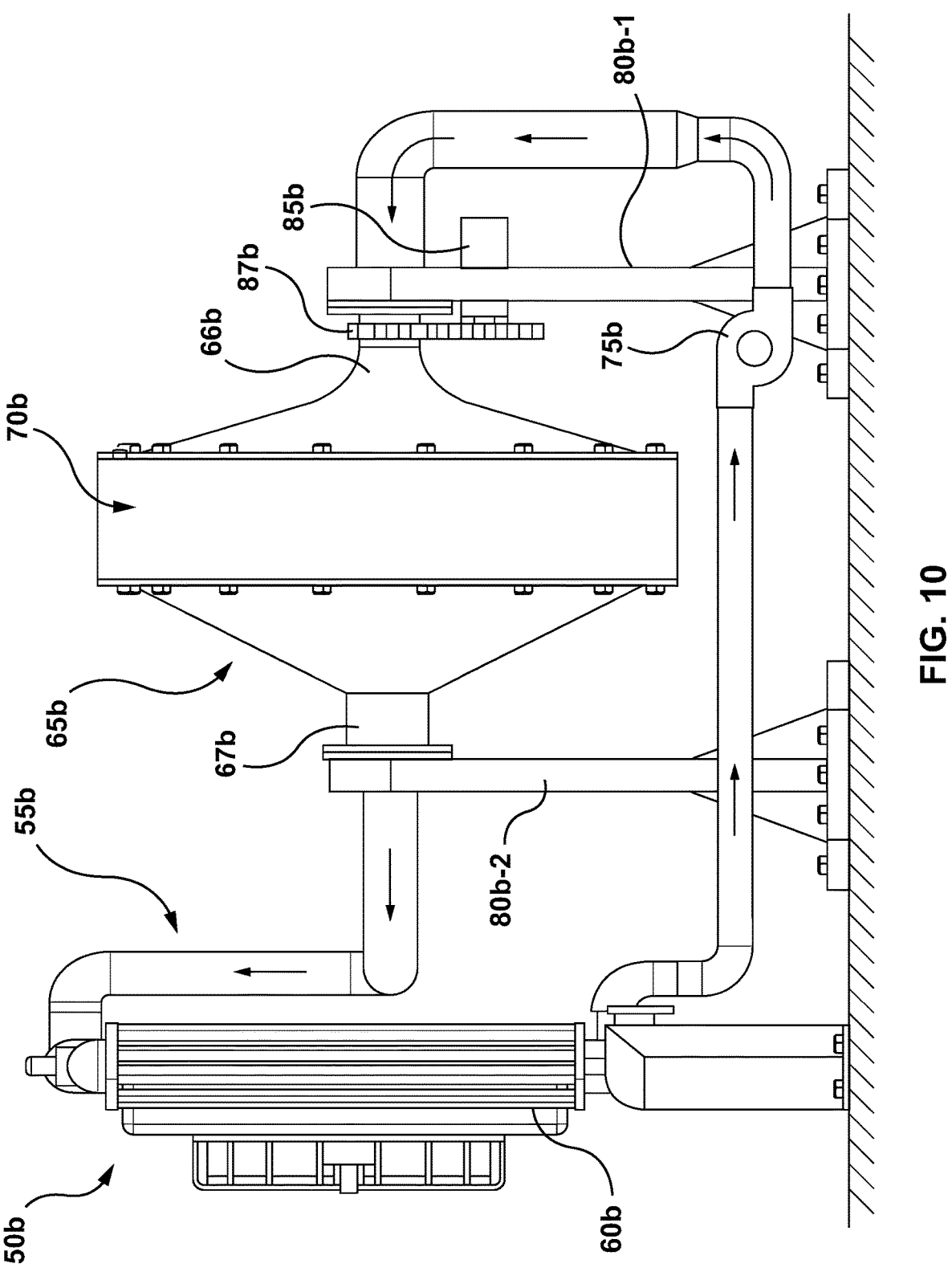
FIG. 10 is a view of another example of an apparatus to recover heat from heat generating elements.

Referring to FIG. 10, an apparatus 50*b* to recover heat from heat generating elements 70*b* is generally shown. Like components of the apparatus 50*b* bear like reference to their counterparts in the apparatus 50, except followed by the suffix "b". In the present example, the apparatus 50*b* includes a fluid flow system 55*b*, a heat exchanger 60*b*, a chamber 65*b*, a plurality of heat generating elements 70*b*, a pump 75*b*, and a motor 85*b*.

In the present example, the supports 80*b*-1 and 80*b*-2 are coupled to the ends of the chamber 65*b* using a rotatable coupling that allows for low friction rotation of the chamber 65*b* relative to the fluid flow system 55*b*. For example, the coupling may include the use of ball-bearings, roller bearings, sleeve bearings, or bushings. It is to be appreciated by a person of skill with the benefit of this description that the relative rotation of the chamber 65*b* will promote the movement of the fluid within the chamber 65*b* to enhance heat distribution from the heat generating elements 70*b* to the fluid.

The apparatus 50*b* may further include various components to rotate the chamber 65*b*. For example, a controller may be included to operate the motor 85*b*. In the present example, the motor 85*b* is an electric motor coupled to an end of the chamber 65*b* with a chain 87*b*. It is to be appreciated by a person of skill that the coupling mechanism is not particularly limited and may include gears, belts, or other transmission systems, enabling the control of an oscillation or continuous rotation of the chamber 65*b*. Oscillation or rotation of chamber 65*b* may provide two benefits. First, the movement provides turbulent flow regimes which may enhance heat distribution and transfer from the heat generating elements 70*b* to the fluid. Second, the movement may reduce any heat concentrations that might arise from natural convective flow driven by gravity and temperature differentials in the fluid. In an example, the motor 85*b* may control the oscillation or continuous rotation of the chamber 65*b*.

In operation, the fluid absorbs heat while flowing through the radial layer as a result of forced convection. As discussed above, the fluid selected may be a non-conductive fluid with a high specific heat capacity such that the fluid may contact the electrical components without shorting the connections. At first, the fluid may be supplied from an inlet 66*b* coupled to an elongated tube at the support 80*b*-1. As the fluid may be transferred towards the heat generating elements 70*b*, a controller may oscillate or rotate the chamber 65*b*. The chamber 65*b* in the present example may oscillate between about 0 degrees and about 270 degrees. In other examples, the chamber 65*b* may be rotated continuously in a clockwise or counter-clockwise direction. The heat generating elements 70*b* increase the temperature of the fluid from the heat generated during operation inside the chamber 65*b*. After the fluid is heated, the hot fluid may be transferred towards the heat exchanger 60*b*. In the present example, the outlet 67*b* may be connected to the heat exchanger 60*b*. The heat exchanger 60*b* may be configured to cool down the hot fluid using surrounding air or receiving a continuous flow from another fluid and cool down the hot fluid from system by transferring its heat energy into this second fluid.

Figure 11:
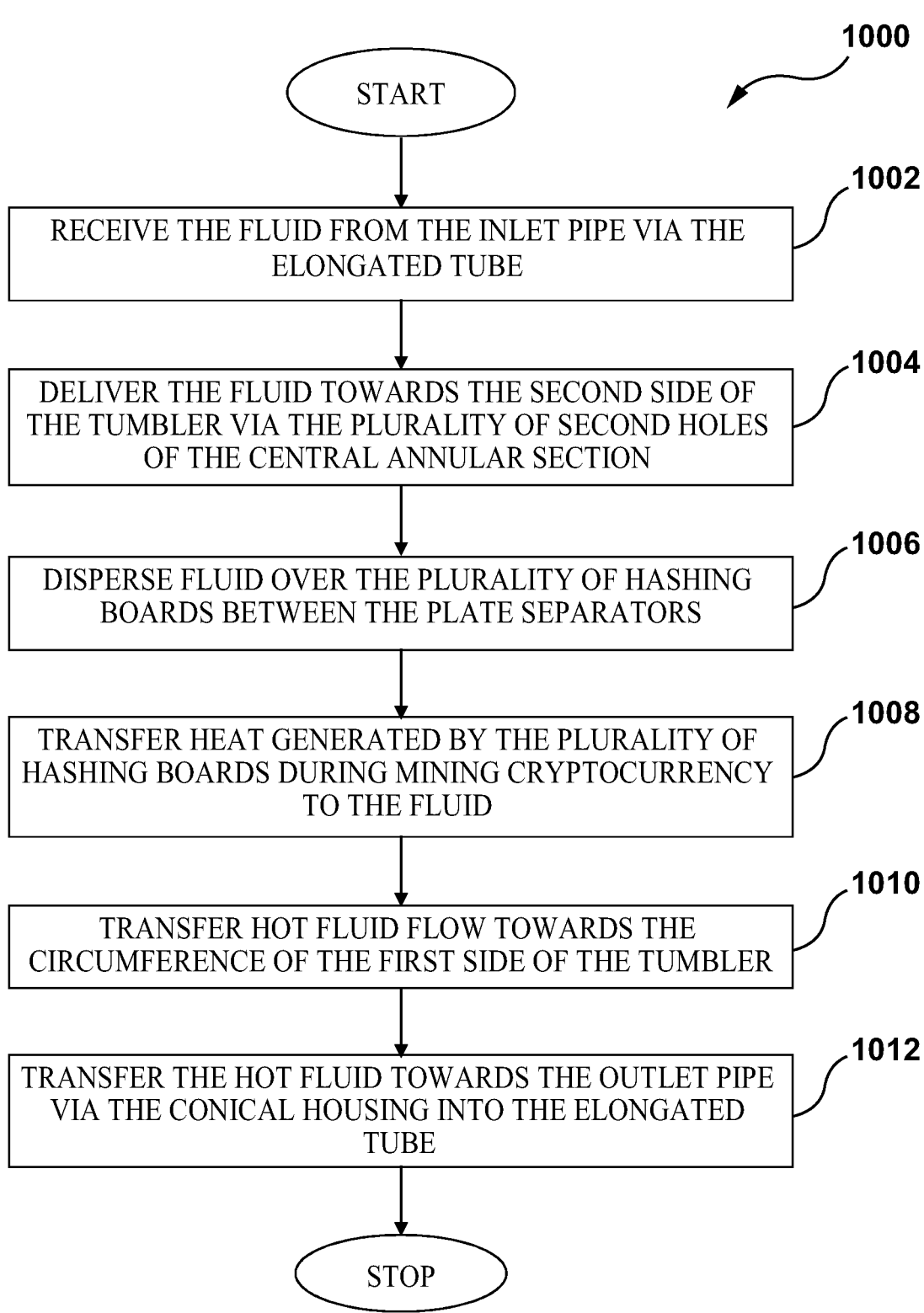
FIG. 11 is a flowchart of an example process of recovering heat from heat generating elements.

Referring to FIG. 11, a flowchart of steps for recovering heat generated by the cryptocurrency mining process is shown. The method for recovering heat generated by the cryptocurrency mining process is explained with reference to the apparatus 50 and steps shown in the method 1000. One skilled in the art with the benefit of the present description will appreciate that, for this and other processes and methods disclosed herein, the functions performed in the processes and methods may be implemented in differing order. Furthermore, the outlined steps and operations are only provided as examples. Some of the steps and operations may be optional, combined into fewer steps and operations, or expanded into additional steps and operations without detracting from the disclosed examples.

The method 1000 is explained in conjunction with the apparatus 50. The method 1000 involves a mining operation that generates heat during a hashing process. This generated heat may be transferred to a fluid supplied from the inlet 66 and discharged or released from the outlet 67. At first, a chamber 65 may receive the fluid from the inlet 66 via an elongated tube at step or block 1002. The fluid may be water or any non-conductive fluid with a high specific heat capacity. The fluid flow within the chamber 65 may deliver the fluid towards an inlet portion 150 of the chamber 65 via the second plurality of holes 112 of the central annular section 160 at step or block 1004. The fluid received via the second plurality of holes 110 may get dispersed over the plurality of hashing boards or processing units at step or block 1006. In the present example, the chamber 65 is fixed on the supports 80. However, in some examples, the chamber 65 may be configured to oscillate or rotate the heat generating elements 70 using a controller and motor. The heat generating elements 70 may also include heat sink units 315 to transfer heat generated by the plurality of hashing boards 300 to the fluid during operation, such as mining cryptocurrency, at step or block 1008.

In examples where the chamber 65 is oscillated or rotated, the fluid receiving heat from the heat sink units 315 may be transferred towards the outer circumference of the chamber 65 from the centrifugal force at step or block 1010. Further, the fluid may be directed towards the outlet 67 via the conical housing 205-2 at step or block 1012. After the hot fluid exits the chamber 65, it is delivered to the heat exchanger 60 for further processing, where the fluid may be cooled and then supplied to pump 75. The heat exchanger 60 may transfer heat energy from the fluid in the fluid flow system 55 to the air or to a second fluid, where it can be used for space heating, generating domestic hot water, or other purposes.

Figure 12:
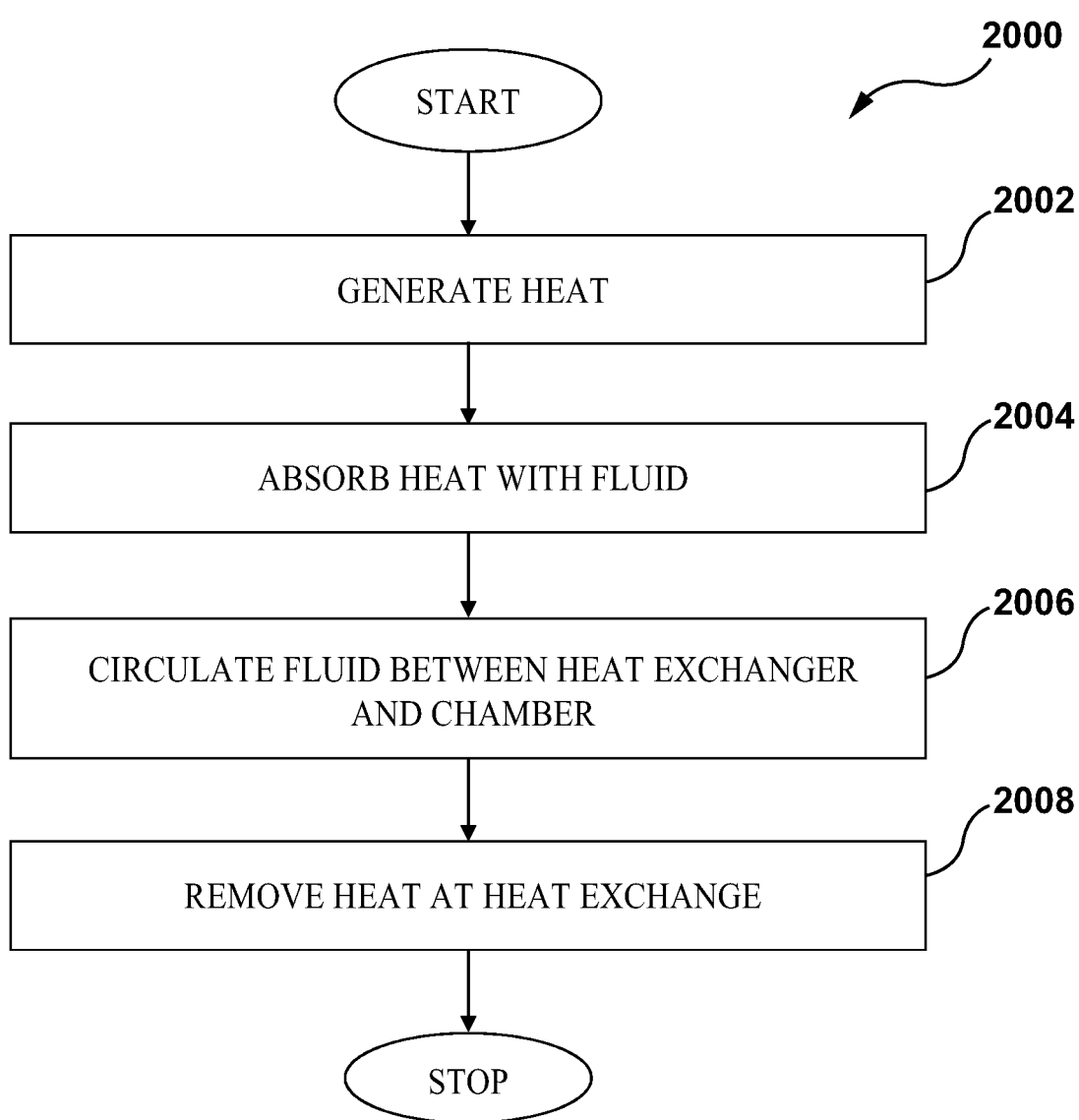
FIG. 12 is a flowchart of another example process of recovering heat from heat generating elements.

Referring to FIG. 12, a flowchart of a method 2000 of recovering heat from a plurality of heat generating elements 70 is generally shown. In order to assist in the explanation of method 2000, it will be assumed that method 2000 may be performed with the apparatus 50. Indeed, the method 2000 may be one way in which apparatus 50 may be configured. Furthermore, the following discussion of method 2000 may lead to a further understanding of the apparatus 50 and its various components. In the following discussion, the term "block" is to be used and considered synonymous with the term "step" used above.

Block 2002 involves generating heat via a plurality of heat generating elements 70. In the present example, the heat generating elements 70 are disposed within a chamber 65 and immersed in a fluid. The heat generating elements 70 are not limited and may be a collection of different components that generate heat during operation. In the present example, the heat generating elements 70 are computer components operating to mine cryptocurrency resulting in resistive heating from current flowing through conductors, such as a printed circuit board or wiring. In other examples, the heat generating elements 70 may be computer components carrying out other computational operations for other applications, such as modelling complex physical systems, simulations, or machine learning.

Next, block 2004 comprises absorbing the heat generated by the heat generating elements 70 with the fluid. In some examples, the heat generating elements 70 may be thermally coupled to a heat sink unit 315 to further aid in the absorption of the heat by the fluid. Block 2006 involves circulating the fluid from the chamber 65 after absorbing the heat through the fluid flow system 55 to the heat exchanger 60. In the present example, the fluid flow system 55 includes a pump 75 to circulate the fluid between the chamber 65 and the heat exchanger 60 where the heat is removed from the fluid at block 2008.

It is to be appreciated by a person of skill with the benefit of this description that the apparatus may be constructed in a modular fashion, which may facilitate the installation of the apparatus at new locations, and may provide scalability. By generating economic value from both cryptocurrency accumulation and heat generation, the apparatus 50 may be able to produce heat at a lower cost than an equivalent electrical resistance heating system. Furthermore, the apparatus may avoid significant carbon emissions if the lower cost heat allows the apparatus to replace or supplement fossil fuel based heating systems. Furthermore, the unique architecture of the apparatus may provide a more ecological way of mining cryptocurrency. Therefore, the apparatus facilitates mining cryptocurrency and sustainably recovering the heat dissipated during cryptocurrency mining. Such a system facilitates the advantage of producing a dual revenue stream of cryptocurrency and electrically generated heat.

It should be recognized that features and aspects of the various examples provided above may be combined into further examples that also fall within the scope of the present disclosure.

What is claimed is:

1. An apparatus comprising: a closed-loop fluid flow system having a fluid charged therein, wherein the fluid is to absorb heat; a heat exchanger disposed along the closed-loop fluid flow system to remove the heat from the fluid; a chamber disposed along the closed-loop fluid flow system to receive the fluid at an inlet and to release the fluid from an outlet; a plurality of heat generating elements disposed in the chamber, wherein each heat generating element of the plurality of heat generating elements is immersed in the fluid; a pump to circulate the fluid in the closed-loop fluid flow system between the heat exchanger and the chamber; and a separation wall disposed in the chamber between the inlet and the outlet to separate a volume in the chamber into an inlet portion and an outlet portion, wherein the heat generating elements include a processing unit and a power supply unit, the power supply unit is disposed in the inlet portion and the processing unit is disposed in the outlet portion; and wherein the chamber is rotatable relative to the closed-loop fluid flow system to promote movement of the fluid over the heat generating elements to enhance heat distribution.

2. The apparatus of claim 1, wherein the separation wall directs flow of the fluid radially away from the inlet.

3. The apparatus of claim 2, wherein the separation wall includes one or more openings along a border of the separation wall to allow the fluid to flow from the inlet portion to the outlet portion.

4. The apparatus of claim 3, wherein the fluid is collected at the outlet causing the fluid to flow in a substantially radial direction from the one or more openings.

5. The apparatus of claim 1, wherein the processing unit comprises a control board and a hashing board, wherein the processing unit is to mine cryptocurrency.

6. The apparatus of claim 1, further comprising a motor coupled to the chamber, wherein the motor is to rotate the chamber.

* * * * *